United States Patent
Kuipers et al.

(10) Patent No.: US 7,384,228 B2
(45) Date of Patent: Jun. 10, 2008

(54) INSERTION DEVICE, LITHOGRAPHIC APPARATUS WITH SAID INSERTION DEVICE AND DEVICE MANUFACTURING METHOD

(75) Inventors: Leo Wilhelmus Maria Kuipers, Eindhoven (NL); Johannes Hendrikus Gertrudis Franssen, Eersel (NL)

(73) Assignee: ASML Netherlands B.V., Veldhoven (NL)

( * ) Notice: Subject to any disclaimer, the term of this patent is extended or adjusted under 35 U.S.C. 154(b) by 433 days.

(21) Appl. No.: 10/851,647

(22) Filed: May 24, 2004

(65) Prior Publication Data

US 2005/0281638 A1    Dec. 22, 2005

(51) Int. Cl.
*F16M 1/00* (2006.01)

(52) U.S. Cl. .......... 414/217; 414/222.04; 414/936; 414/939; 33/645; 378/34; 248/612

(58) Field of Classification Search ........... 414/222.04, 414/222.05, 226.04, 226.05, 936; 901/35; 33/645; 248/612
See application file for complete search history.

(56) References Cited

U.S. PATENT DOCUMENTS

| | | | | |
|---|---|---|---|---|
| 3,626,769 A | * | 12/1971 | Hecker et al. ............... | 74/44 |
| 4,343,584 A | * | 8/1982 | Hudgins ................ | 414/222.07 |
| 4,352,643 A | * | 10/1982 | Iijima .......................... | 417/313 |
| 4,411,576 A | * | 10/1983 | Smith et al. ............ | 414/224.01 |
| 4,601,110 A | * | 7/1986 | Donaldson .................. | 33/547 |
| 4,803,712 A | * | 2/1989 | Kembo et al. ............... | 378/34 |
| 5,195,113 A | * | 3/1993 | Kuwabara ..................... | 378/34 |
| 5,207,554 A | * | 5/1993 | Asakawa et al. ........ | 414/744.6 |
| 5,687,947 A | * | 11/1997 | Iwamoto et al. ........... | 248/612 |
| 5,746,562 A | * | 5/1998 | Hasegawa et al. .......... | 414/217 |
| 5,931,626 A | * | 8/1999 | Theriault .................... | 414/217 |
| 6,085,125 A | * | 7/2000 | Genov ......................... | 700/218 |
| 6,185,830 B1 | * | 2/2001 | Walters ........................ | 33/533 |
| 6,298,280 B1 | * | 10/2001 | Bonora et al. ............. | 700/218 |
| 6,425,280 B1 | * | 7/2002 | Ames et al. .................. | 73/1.79 |
| 6,430,468 B1 | * | 8/2002 | Tepman et al. ............. | 700/218 |
| 6,707,528 B1 | * | 3/2004 | Aoyama et al. ............... | 355/18 |
| 6,774,374 B1 | * | 8/2004 | Driessen et al. ......... | 250/492.2 |
| 6,820,349 B2 | * | 11/2004 | Peine .......................... | 33/645 |
| 6,944,517 B2 | * | 9/2005 | Krupyshev .................. | 700/114 |
| 2003/0168175 A1 | * | 9/2003 | Kim et al. ............. | 156/345.51 |
| 2003/0177656 A1 | * | 9/2003 | Sawdon ....................... | 33/645 |

FOREIGN PATENT DOCUMENTS

| EP | 858867 | * | 8/1998 |
|---|---|---|---|
| JP | 3-167511 | * | 7/1991 |

* cited by examiner

*Primary Examiner*—James Keenan
(74) *Attorney, Agent, or Firm*—Pillsbury Winthrop Shaw Pittman LLP

(57) ABSTRACT

A robot arm is configured to insert and remove an object from a conditioned environment using a carrier connected to the robot arm. The robot arm is positioned in a conditionable vessel, a wall of which vessel may deform when the interior is conditioned. Since the trajectory of the robot arm needs to be accurate, the robot arm is flexibly coupled to the vessel wall such that an orientation of the robot arm is independent from an orientation of the vessel wall. Further, a docking system is disclosed for use in a device including a robot arm having a carrier connected thereto.

19 Claims, 3 Drawing Sheets

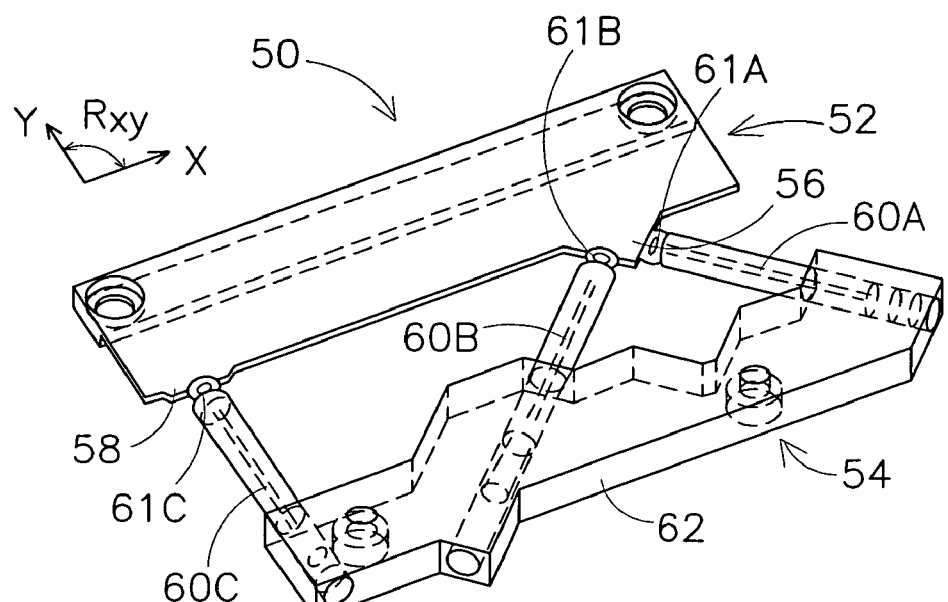
Fig. 7
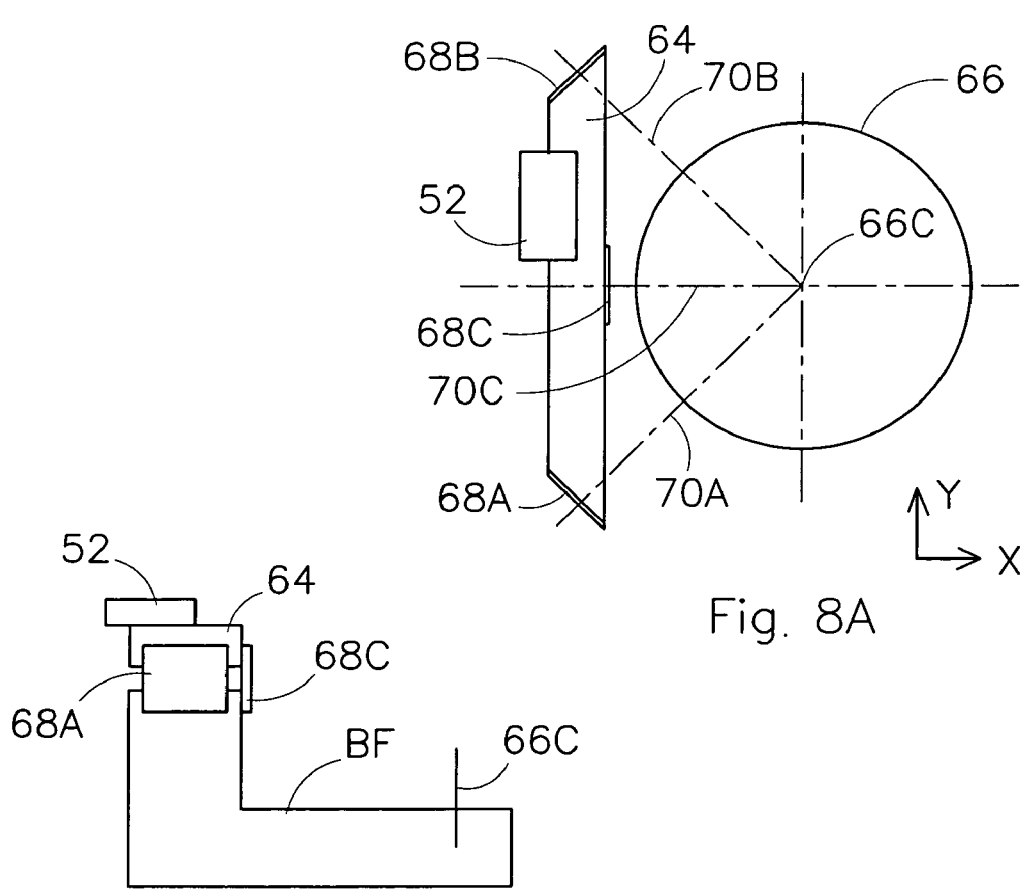
Fig. 8A
Fig. 8B

INSERTION DEVICE, LITHOGRAPHIC APPARATUS WITH SAID INSERTION DEVICE AND DEVICE MANUFACTURING METHOD

BACKGROUND OF THE INVENTION

1. Field of the Invention

The present invention relates to an insertion device, a lithographic apparatus and a device manufacturing method. In particular, the present invention relates to an insertion device configured to insert an object into a conditioned environment.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a prior art lithographic apparatus, the imaging of the circuit pattern onto the target portion is performed within a conditioned environment, such as, for example, within a chamber with reduced pressure (e.g., vacuum). To project an image onto the substrate, the substrate needs to be positioned within the conditioned environment. Inserting the substrate into the conditioned environment is performed by using a conditionable vessel which contains a conditionable interior. That is, the vessel interior may be configured with the capability of adjusting the pressure inside the vessel and/or controlling the number of particles present inside the vessel. The conditionable vessel may be part of an insertion device. Note that such an insertion device, as well as the conditionable vessel, may not only be employed inserting the substrate into the conditioned environment, but may also be employed for removing the substrate from the conditioned environment. Also, the conditionable vessel or the insertion device may be employed for other objects than a substrate such as a patterning device, for example.

A conditionable vessel is typically positioned between the conditioned environment and the outside (e.g. atmospheric environment) and functions as an intermediate chamber. The conditions inside the intermediate chamber (i.e. within the interior of the vessel), may vary. When an object is to be loaded into the conditioned environment of the lithographic apparatus, the object is first loaded into the intermediate chamber through a first gate in the vessel, whereby the intermediate chamber is subjected to atmospheric conditions and/or dust particles. After closure of the first gate, the interior of the vessel is conditioned such that the conditions are substantially equal to the conditions in the conditioned environment of the lithographic apparatus. Then, a second gate in the vessel connecting the interior of the vessel with the conditioned environment of the lithographic apparatus may be opened and the object may be transferred from the vessel to the lithographic apparatus.

To transfer the object from the atmospheric environment to the conditioned environment, a robot arm may be positioned in the atmospheric environment to transfer the substrate from the atmospheric environment through the first gate into the vessel. Inside the vessel, the object is positioned on a pad or the like. Then, after closing the first gate of the vessel, the environmental conditions inside the vessel may be changed such that they correspond to the environmental conditions of the conditioned environment.

A robot arm inside the conditionable vessel then transfers the object from said pad or the like into the conditioned environment through the second gate. To the robot arm, there is connected an object support pad for carrying the object. A robot arm trajectory is therefore to be set to transfer the object support pad and the object thereon through the second gate. Moving the object support pad through the first or the second gate requires a highly accurate movement along said robot arm trajectory. Therefore, it is required to minimize any disturbance of the trajectory of the robot arm and object support pad to ensure a transfer through the gate and an accurate positioning of the object.

The first gate and the second gate may be the same gate. However, to transfer the object from a first environment to a second environment, the environment outside the conditionable vessel needs to be changed from the first to the second environment while the object is inside the conditionable vessel. For example, the gate of the conditionable vessel may be repositioned with respect to the first and second environment, while the interior of the vessel having the object therein is being conditioned.

Generally, a robot controlling the robot arm is attached to the outside of the vessel and position the robot arm and the object support pad inside the vessel through an opening in the vessel wall. During production of the vessel, the robot is mounted on the vessel wall and the robot arm trajectory is set with respect to the vessel, in particular with respect to the gate through which the robot arm is going to transfer the object, as mentioned above.

After production of the insertion device comprising the conditionable vessel and robot, it is no longer possible to adjust the trajectory of the robot arm and object support pad without opening the vessel. However, if the trajectory gets disturbed, the vessel needs to be opened to reset the trajectory. Opening the vessel may be difficult due to a complex construction, which has been designed to create the conditioned interior, such as, for example, the creation of a gas-tight vessel construction. After adjustment, the interior may need to be reconditioned, rendering the adjustment procedure not only difficult, but also time-consuming and expensive.

Since the vessel wall may undergo a deformation, such as when the pressure inside the vessel is reduced, because the robot is attached to the outside of the vessel, the orientation and position of the robot, as well as the robot arm and its trajectory, may be disturbed due to the vessel wall deformation. Generally, to minimize the disturbance of the robot arm trajectory, the robot is positioned in the center of the vessel wall. Due to the reduced pressure inside the vessel, the vessel wall becomes concave. In the center, the vessel wall keeps its orientation, and thus the orientation of the robot arm will not be changed when the vessel wall deforms due to the reduced pressure inside the vessel.

Positioning the robot in the center of a vessel wall, however, limits the design of the vessel. To reduce the size of the vessel, thereby requiring less space, it has been found that it is advantageous to position the robot asymmetrically, i.e. not in the center, with respect to the vessel wall.

SUMMARY OF THE INVENTION

The principles of the present invention, as embodied and broadly described herein, provide a robot arm in a conditionable vessel such that when the conditions inside the vessel are changed, the trajectory of the robot arm is not disturbed. Additionally, the robot arm may be positioned asymmetrically with respect to the conditionable vessel wall without the trajectory of the robot being disturbed when the conditions inside the vessel are changed.

To this end, in accordance with one embodiment, an insertion device is presented, which comprises a vessel having a vessel wall and an interior that is conditionable; a gate positioned in the vessel wall configured to enable the transfer of the object into and out of the vessel; an insertion robot having a robot arm in which at least a portion of the robot arm extends into the vessel interior; and an object support pad coupled to the portion of the robot arm that extends into the vessel interior, the object support pad configured to carry the object along a predetermined trajectory through the gate, wherein the robot arm is essentially dynamically decoupled from the vessel wall in at least one degree of freedom.

Since the robot arm and the vessel wall are essentially dynamically decoupled in at least one degree of freedom, the vessel wall may deform without substantially changing the orientation of the robot arm, although the robot arm and the vessel wall may be statically coupled. Thus, the trajectory of movement of the robot arm is not substantially changed due to the deformation of the vessel wall in the at least one degree of freedom. As the orientation of the robot arm is not changed due to any deformation in the at least one degree of freedom, the robot arm may be positioned, and may be essentially statically coupled to, any location of the vessel wall. Thus, the robot arm may be asymmetrically positioned with respect to the vessel wall, taking into account the directions in which the robot arm and the vessel wall are essentially dynamically decoupled.

In an embodiment of the present invention, the robot arm and the vessel wall are flexibly coupled such that an orientation of the robot arm is essentially independent from an orientation of the vessel wall.

In the insertion device according to the present invention, the robot arm is, either directly or indirectly, flexibly coupled to the vessel wall. With a suitable flexible coupling, creating a static but not a dynamic coupling, the vessel wall may deform, for example due to a reduced pressure inside the vessel, without disturbing the robot arm and its trajectory of movement. Such a coupling absorbs in particular low-frequency vibrations and/or deformations of the vessel wall such that the vibrations and/or deformations are not transferred to the robot arm, and thus the flexible coupling results in an essentially dynamical decoupling in at least one degree of freedom. A coupling means creating a suitable flexible coupling may for example be a spring, an air mount, or the like. As mentioned above, without the influence of the vessel wall on the robot arm, the robot arm may be positioned at any position with respect to the vessel.

The robot and the vessel need to be positioned relative to each other such that the robot arm and the object support pad are positioned inside the vessel. The robot itself may be positioned inside or outside the vessel, as is described and illustrated below.

The conditionable vessel needs to be gas-tight in order to have a conditionable interior, in particular in order to have a reduced pressure in its interior. As a result of the requirements of the gas-tight vessel and the positioning of the vessel with respect to at least the robot arm, it is virtually impossible to prevent that the vessel and the robot arm are mechanically coupled. However, if the coupling is achieved by using flexible means, thus creating a flexible coupling, the vessel walls may deform without influencing the orientation of the robot arm.

In an embodiment of the present invention, the robot arm of the insertion robot extends into the vessel through an opening in the vessel wall, the opening being sealed by a seal. The seal is flexible and gas-tight, for example a bellows, or the like. To prevent a stiff coupling of the robot arm and the vessel, the robot and the vessel are separately mounted on the frame, while mounting the vessel and the robot on one frame keeps them in place relative to each other.

In a further embodiment, the insertion robot and the conditionable vessel may be mounted on a frame. The vessel may be mounted on the frame using a flexible mounting assembly, for example comprising springs, air mounts and/or the like. If the vessel deforms, e.g. when the pressure inside the vessel is reduced, the flexible mounting assembly prevents that any tensions in and deformations of the frame occur. Thus, the orientation of the robot and its robot arm is not influenced when the orientation of the vessel walls change due to the above-mentioned deformations and/or vibrations.

When the robot is positioned outside the vessel, the robot arm is to be positioned at least partially inside the vessel. Thereto, the robot arm extends into the vessel through an opening. To enable the interior environment being conditioned, the vessel should be gas-tight as mentioned above. A seal disposed between the periphery of the opening and the robot arm or a robot housing ensures that the vessel is gas-tight. In case the seal is attached to the robot housing, the robot housing may need to be gas-tight too to prevent any gas from flowing from the outside environment through the robot and the opening into the vessel. Further, to prevent a stiff coupling between the vessel and the robot arm, the seal should be flexible. A flexible and gas-tight seal may be constructed of a flexible and gas-tight tube-like member, such as a bellows, or the like.

As mentioned above, the seal may be attached to a wall of the vessel and to the robot arm. In such a case, the flexible seal may move with the robot arm over predetermined distances and results thus in a simple and cost-effective gas-tight construction without generating a stiff mechanical coupling.

In another embodiment of the present invention, a housing of the robot may be stiffly coupled to the vessel and the orientation of the robot arm may be independent from the orientation of the robot housing for small orientation variations, such as deformations and vibrations. With the robot housing being attached to the vessel wall it is stiffly coupled thereto. The robot arm however should not be stiffly, but flexibly coupled to the vessel. Therefore, the robot arm should not be stiffly coupled to the robot housing. In this embodiment, a special kind of robot may be used or a special kind of robot housing may be used. The orientation of the robot arm may for example be controlled by a gyrostabilizer or the like, substantially invariant to small orientation changes of the robot housing. The gyrostabilizer generates a pseudo-flexible coupling, since the coupling established by the gyrostabilizer may be stiff, but the orientation of the robot arm is controlled by the gyrostabilizer and is thus invariant to small orientation changes of the vessel wall, in particular for low frequency disturbances. In this embodiment, the robot housing should be gas-tight to prevent air leakage if the housing is situated at least partly outside the vessel wall. Note that in this embodiment, the robot may as well be positioned inside the conditionable vessel. In the latter embodiment, the robot housing is not required to be gas-tight.

According to a further aspect of the invention, there is provided a lithographic apparatus comprising an insertion device configured to transfer a substrate or a patterning device into or out of a conditioned environment, the insertion device comprising a support structure configured to support a patterning device that imparts a desired pattern on a beam of radiation; a substrate holder configured to hold a substrate; and an insertion device configured to transfer a substrate or a patterning device into and/or out of a conditioned environment. The insertion device comprises a vessel having a vessel wall which defines an interior that is conditionable; a gate positioned in the vessel wall, the gate configured to enable the transfer of the object into and/or out of the vessel; an insertion robot having a robot arm in which at least a portion of the robot arm extends into the vessel interior; and an object support pad coupled to the portion of the robot arm that extends into the vessel interior, the object support pad configured to carry the object along a predetermined trajectory through the gate, wherein the robot arm is essentially dynamically decoupled from the vessel wall in at least one degree of freedom.

In one embodiment of the lithographic apparatus according to the present invention, the object support pad carries the substrate or the patterning device between the vessel and a substrate table or a patterning device support structure, respectively, through a gas-tight passageway, for example a bellows, or the like. Such a construction prevents a stiff coupling between the insertion device and a frame supporting the substrate table and possibly other parts of the lithographic apparatus.

In another embodiment of the present invention, in order to insert or remove a substrate or a patterning device into or out of the conditioned environment, the insertion device may be provided with a separate load position and a separate unload position for substantially parallel loading of a first substrate or first patterning device and unloading a second substrate or second patterning device. Providing separate positions for loading and unloading a substrate or patterning device improves the throughput of the apparatus. For example, one substrate may be positioned at the load position to be input, while another substrate is being processed. As soon as the other substrate is output to the unload position, the robot may immediately collect the first substrate positioned at the load position. Such a construction thus reduces a dead time of the lithographic apparatus, when compared to the situation in which an output substrate first has to be removed and replaced by the next substrate to be processed at a load/unload position before the next substrate can be input.

In the above mentioned embodiment, the load position may be located in a conditionable load chamber having a load gate to an outside environment for receiving the substrate or the patterning device from an outside environment; and the unload position may be located in a conditionable unload chamber having an unload gate to the outside environment for delivering the substrate or the patterning device to the outside environment; the load and the unload chamber each having a transfer gate to the vessel for transferring the substrate or the patterning device between the load or unload chamber and the vessel.

In another embodiment, the object support pad is provided with at least a part of a docking system to position the object at a predetermined object location. In a further preferred embodiment, the docking system comprises a first and a second part, the first and second part being accurately positioned relative to each other when the first and second part engage in a predetermined manner, the first part being provided on the object support pad, and the second part being accurately positioned with respect to the predetermined object location such that the first and second part engage in the predetermined manner when the object support pad reaches the predetermined object location. Thus the docking system enables simple and accurate positioning of the object support pad with respect to the predetermined object location.

To minimize an influence of temperature changes, at least one of the parts of the docking system is mounted on a docking frame, the docking frame being mounted on a base frame using a plurality of leaf springs. Each of the leaf springs is positioned to bend in a direction of a line, the lines corresponding to the respective leaf springs intersecting at a center of the predetermined object location. Such a configuration of the docking frame with respect to a center of the predetermined object location is insensitive to temperature changes, while the material of which the base frame is constructed may expand/contract due to temperature changes. Preferably, the docking frame is constructed of a material having a small thermal expansion coefficient, such as Invar.

Advantageously, one of the parts of the docking system is a docking plate comprising a V-shaped segment and a straight segment, and the other part is a docking device comprising three cues. One of the cues is configured to engage an edge of the straight segment of the docking plate and the other two cues are configured to engage respective edges of the V-shaped segment. Engaging the two parts of the docking system as described unambiguously and accurately positions the two parts with respect to each other in one plane, thus at an x-position, at an y-position and in a $R_{xy}$-direction (rotation).

According to a further aspect of the invention, a device manufacturing method is provided, the method comprising providing a substrate; providing a support structure configured to support a patterning device that imparts a desired pattern onto a beam of radiation; transferring the substrate or the patterning device between a first environment having a first set environmental conditions and a conditionable vessel of an insertion device, wherein the conditionable vessel includes a wall having a gate positioned thereon and the insertion device includes a robot arm that extends at least partially into the conditionable vessel, the robot arm being essentially dynamically decoupled from the vessel wall in at least one degree of freedom; carrying the substrate or the patterning device via an object support pad coupled to the portion of the robot arm extending into the conditionable vessel; conditioning an interior environment of the conditionable vessel based on a second set environmental conditions; and transferring the substrate or the patterning device through the gate from the vessel interior environment into the second environment via the object support pad.

The insertion device has been described in relation to a substrate or a patterning device. It should be noted, that also other objects may be transferred from a first environment such as an atmospheric environment to a second environment such as a conditioned environment, using the insertion device. Further, as mentioned above, the insertion device may as well be used for removing an object from one environment and transferring it to another, e.g. atmospheric, environment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF DRAWINGS

Embodiments of the invention will now be described, by way of example only, with reference to the accompanying schematic drawings in which corresponding reference symbols indicate corresponding parts, and in which:

FIG. 7 schematically illustrates a docking system used in the insertion device of FIG. 6;

FIG. 8A shows a schematic top view of a mounting construction for mounting the docking device of FIG. 7; and FIG. 8B shows a schematic side view of the mounting construction illustrated in FIG. 8A.

DETAILED DESCRIPTION OF THE INVENTION

Lithographic Apparatus

Figure 1:
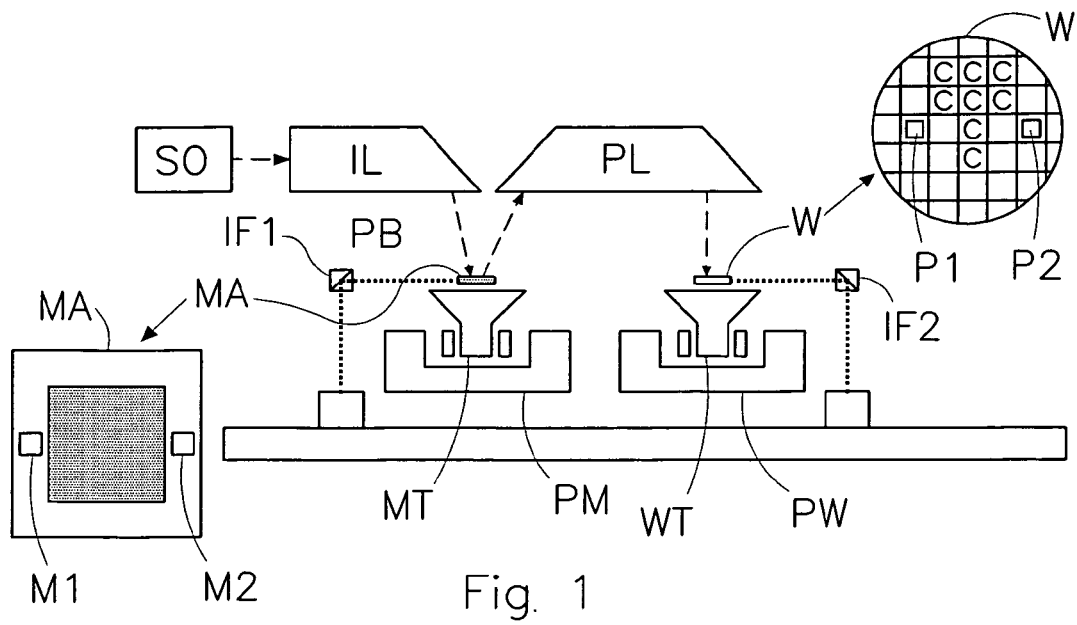
FIG. 1 depicts a lithographic apparatus according to an embodiment of the invention.

FIG. 1 schematically depicts a lithographic apparatus according to a particular embodiment of the invention. The apparatus comprises:
   an illumination system (illuminator) IL: for providing a projection beam PB of radiation (e.g. UV or EUV radiation).

a first support structure (e.g. a mask table/holder) MT: for supporting patterning device (e.g. a mask) MA and connected to first positioning mechanism PM for accurately positioning the patterning device with respect to item PL;

a substrate table (e.g. a wafer table/holder) WT: for holding a substrate (e.g. a resist-coated wafer) W and connected to second positioning mechanism PW for accurately positioning the substrate with respect to item PL; and a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Conventional Vessels

Figure 2:
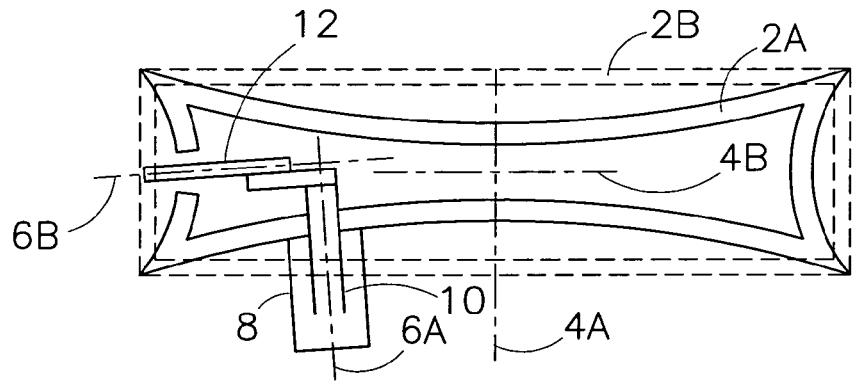
FIG. 2 illustrates an insertion device of the prior art with a tilted robot arm due to reduced pressure inside the vessel.

FIG. 2 schematically depicts a prior art conditionable vessel 2, which is deformed due to reduced pressure inside the vessel 2. The shape of the vessel 2 when not deformed is indicated by dashed lines and reference numeral 2B, while the shape of the deformed vessel 2 is shown in solid lines by reference numeral 2A. A robot 8 is attached to a wall of the vessel 2 and a robot arm 10 extends from the robot 8 into the vessel 2. An object support pad 12 is connected to the robot arm 10. The robot arm 10 may be moveable along and around an axis 6A and the object support pad 12 may be moveable along an axis 6B. The robot arm 10 and pad 12 may transfer an object from inside the vessel 2 to a location outside the vessel 2 through an opening in a side wall.

It is advantageous to position the robot 8 near the side of the vessel 2. Positioning the robot 8 in the center would require a longer robot arm 10. A short robot arm 10 is more stable and more cost-effective. Also, a short robot arm 10 enables an in general small design of the vessel 2. Since the vessel is usually positioned in a cleanroom, i.e. conditioned environment having a low particle concentration, a small vessel 2 results in less cost due to occupied space in said cleanroom.

Due to the higher atmospheric pressure compared to the reduced pressure inside the vessel 2, the vessel 2 is deformed, as illustrated by 2A, in comparison to its original shape 2B. As such, the walls of the vessel 2 have become concave. In the center of the walls, this does not change the orientation of the walls as may be seen from a first axis 4A, which is perpendicular to the wall of the vessel 2, whether the vessel 2 is deformed or not. At all other positions at the wall, the orientation of the wall changed. For example, the axis 6A is tilted with respect to the first axis 4A, as is the axis 6B with respect to a second axis 4B.

The pad 12, however, may be required to move horizontally, both when the pressure inside the vessel is atmospheric and when it is reduced. Thus, it is advantageous that the robot arm 10 would not be disturbed by any deformation of the vessel wall.

Conditional Vessels

Figure 3:
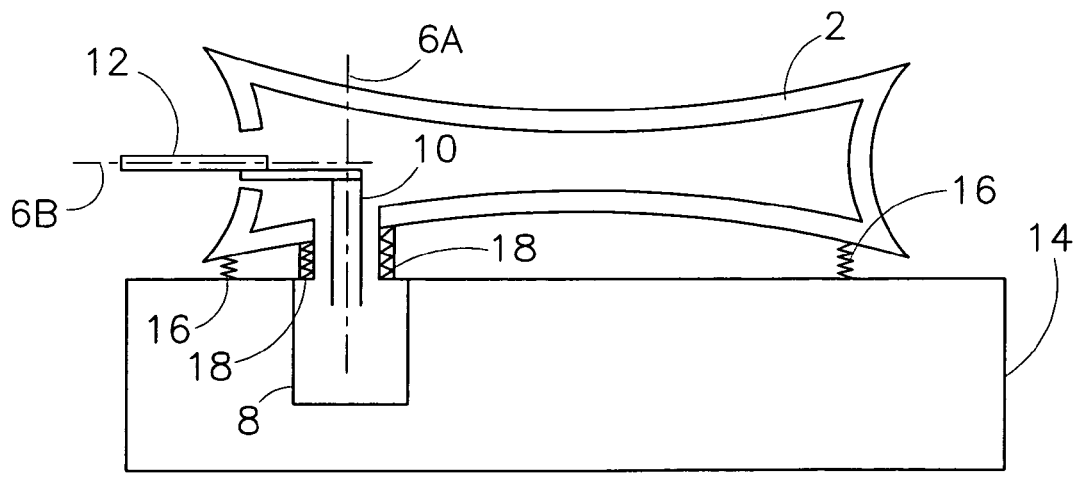
FIG. 3 schematically illustrates an embodiment of an insertion device according to the present invention, wherein the robot arm is decoupled from the vessel.

FIG. 3 illustrates a conditionable vessel 2 and a robot 8 with a robot arm 10 and a pad 12 connected thereto. The pad 12 may be moveable along axis 6B and the robot arm 10 may be moveable around axis 6A. Both vessel 2 and robot 8 are mounted on a frame 14. The vessel 2 may, however, freely deform without disturbing the frame 14 as it is mounted on the frame 14 using one or more springs 16. By virtue of the flexible coupling provided by springs 16, the vessel 2 is essentially dynamically decoupled from the frame 14. The coupling may be any kind of flexible connection that is capable of isolating a deformation of the vessel 2 from the frame 14.

To ensure a gas-tight closure of the vessel 2, a flexible and gas-tight seal is formed by a bellows arrangement 18. The bellows 18 are connected to the vessel 2 at one side and to the robot 8 at the other side. The robot 8, or at least its housing, should be gas-tight to prevent airflow from the robot into the vessel 2, disturbing the reduced pressure environment.

In the embodiment shown in FIG. 3, the orientation of the robot arm 10 and the pad 12 connected thereto may be set independently from the pressure in the vessel 2. The orientation of the robot arm 10 only depends on the orientation of the frame 14 and the orientation of the robot 8 relative to the frame 14. Thus, the orientation of the robot arm 10 may be once set at the time the insertion device is installed. When the vessel 2 deforms, the deformation is compensated by the bellows 18 and there is no disturbance of the orientation of the robot arm 10.

Figure 4:
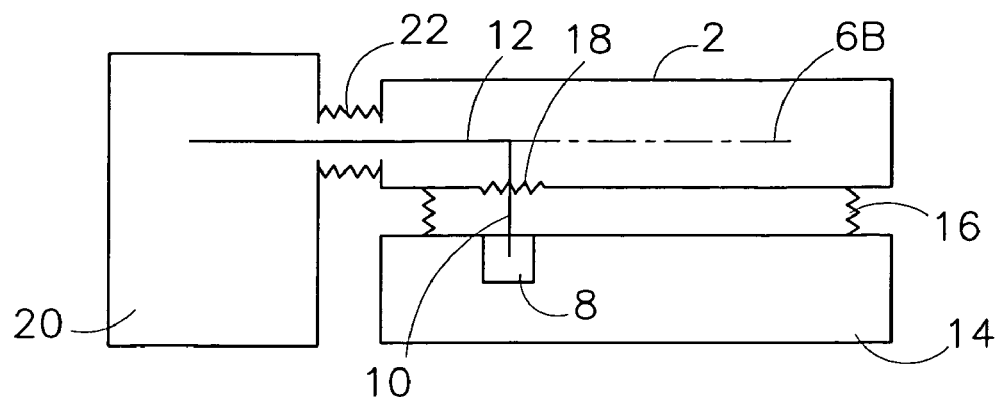
FIG. 4 schematically illustrates an embodiment of a lithographic apparatus according to the present invention.

In FIG. 4, vessel 2 and robot 8 are mounted on a frame 14, the vessel 2 with aid of one or more springs 16. An object support pad 12 connected to the robot arm 10 is moveable along the substantially horizontal axis 6B. Instead of a bellows positioned between the vessel 2 and the robot 8 as shown in FIG. 3, in FIG. 4, a bellows 18 is positioned between the vessel 2 and the robot arm 10. The bellows 18 is flexible and may move along with the robot arm 10. Such a construction imposes few design limitations on the robot 8 and its housing.

In case the object is a substrate and the substrate support pad 12 is positioned in a lithographic apparatus 20, a conditioned environment may be created in the lithographic apparatus 20. The pad 12 may transfer a substrate through a passageway 22 from the insertion device to the lithographic apparatus and back. The passageway 22 is preferably flexible to prevent a stiff mechanical coupling between the insertion device and the lithographic apparatus 20.

Figure 5A:
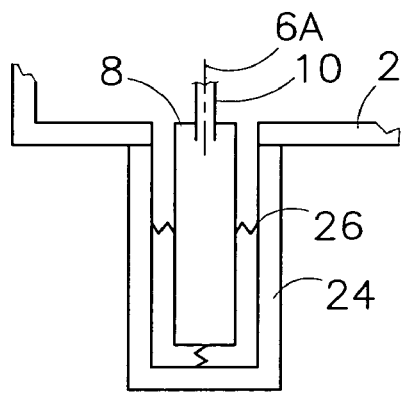
FIG. 5A schematically illustrates an embodiment of the present invention, wherein a robot is positioned inside the vessel.

FIG. 5A schematically illustrates an embodiment wherein the robot 8 is positioned inside the vessel 2 or inside a gas-tight housing 24 connected to the vessel 2. A flexible mounting assembly 26 enables the robot 8 and robot arm 10 to freely or controllably move relative to the vessel 2. The orientation of the robot arm 10 may be controlled by actuators (not shown) to keep its orientation vertical along axis 6A, independent from the orientation of the vessel 2 and its walls. Such control of the orientation may be provided by a gyrostabilizer.

Figure 5B:
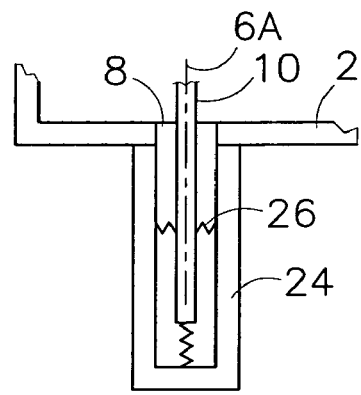
FIG. 5B schematically illustrates an embodiment of the present invention, wherein a robot is attached to the vessel wall and a robot arm is flexibly positioned in a robot housing.

FIG. 5B schematically illustrates an embodiment wherein the robot 8 is attached to the vessel 2. The robot 8 is provided with a gas-tight housing 24 which housing is connected to the vessel 2. A flexible mounting assembly 26 inside the robot housing 24 enables the robot arm 10 to freely or controllably move relative to the vessel 2. The orientation of the robot arm 10 may be controlled by actuators (not shown) to keep its orientation vertical along axis 6A, independent from the orientation of the robot housing 24, the vessel 2 and the vessel walls. Such control of the orientation may be provided by a gyrostabilizer.

Figure 6:
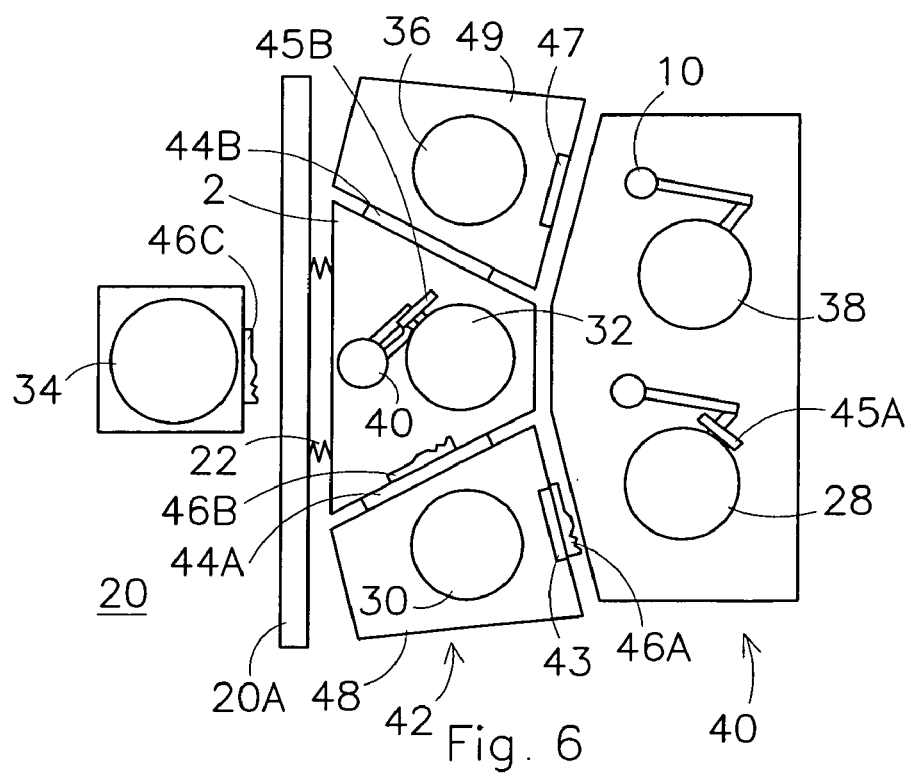
FIG. 6 schematically shows a top view of an insertion device according to the present invention, which is provided with an input and an output position.

FIG. 6 illustrates a load device 40 for lithographic substrates, which load device 40 has been used in the prior art in combination with a lithographic apparatus not having a conditioned environment. Therefore, the load device 40 is not adapted to transport a substrate into a conditioned environment 20. It is however advantageous to re-use the load device 40 in combination with new and future lithographic apparatus, since re-using system elements such as the load device 40 reduces development costs. To use the load device 40 to transfer a substrate into a lithographic apparatus having a conditioned environment 20, an additional insertion device 42 is introduced between the load device 40 and the conditioned environment 20.

The load device 40 comprises two robots (not shown) with robot arms 10. One robot is intended to load a substrate into the insertion device 42 and the other robot is intended to remove a lithographically processed substrate from the insertion device 42. Thereto, one robot comprises a load pad 28 and the other comprises an unload pad 38. Physically, both pads 28 and 38 and/or their respective robots may be identical, but they do not need to be identical.

A substrate is loaded into the insertion device 42 through a load gate 43 and positioned at a load position 30 inside an intermediate chamber 48, i.e. a conditionable vessel. Inside the intermediate chamber 48 the environment may be conditioned and a transfer gate 44A may create a passageway to a vessel 2 having a conditioned environment, e.g. a reduced pressure. A third robot arm 10 having a substrate support pad 32 may remove the substrate from the load position 30 and transfer the substrate into the lithographic apparatus via a bellows 22 and an opening through the apparatus wall 20A. The bellows 22 may however be replaced by any other suitable, a passageway-creating device between the insertion device 42 and the lithographic apparatus having a conditioned environment 20 inside.

The substrate is positioned at a substrate table 34 where it may be processed or it may be transferred to any other location inside the lithographic apparatus to be processed. After processing the substrate, the substrate is positioned on the substrate table 34 in front of the opening through the apparatus wall 20A. The substrate support pad 32 may be used to transfer the substrate from the substrate table 34 to an unload position 36 in an intermediate chamber 49. Said unload position 36 may the same position as the load position 30 or may be a separate position 36, as illustrated in FIG. 6. The same applies to the intermediate chamber 49, so there may be one intermediate chamber 48 or there may be two intermediate chambers 48 and 49 as illustrated. The substrate may be unloaded from the insertion device 42 by a robot having an unload pad 38.

Now, the functioning of the insertion device 42 will be described in more detail. A substrate positioned on the load pad 28 may have a known position and orientation with respect to the load pad 28. In particular, since the load device 40 has been used in combination with previously developed apparatus, the load device 40 has been developed to accurately receive and supply a substrate. To be able to use the known position and orientation of the substrate, the substrate has to be accurately positioned on the load position 30. Thereto, the insertion device 42, in particular the intermediate chamber 48 thereof, is provided with a first docking element 46A, and the load pad 28 is provided with a first complementary docking element 45A. The docking element 46A and the complementary docking element 45A form together a docking system, such as the one that is described in more detail in relation to FIG. 7.

After positioning the substrate in the intermediate chamber 48 on the load position 30, the load pad 28 is removed from the intermediate chamber 48. A gate 43 through which the substrate has been introduced in the intermediate chamber 48 is then closed and the environment in the intermediate chamber 48 is being conditioned to obtain the same conditioned environment as existing in the vessel 2. This conditioned environment, equaling the conditioned environment 20 inside the lithographic apparatus, may have a reduced pressure and/or have a low particle concentration and/or have other characteristics such as a high pressure, specific gas mixture, or the like.

When the environment in the intermediate chamber 48 equals the conditions inside the vessel 2, a gate 44A between the intermediate chamber 48 and vessel 2 may be opened without disturbing the conditions inside the vessel 2. A robot having a robot arm 10 with a substrate support pad 32 enters the intermediate chamber 48 through the opening created by the gate 44A and takes the substrate to the vessel 2. To prevent loss of information of position and orientation of the substrate, the substrate support pad 32 is docked before taking the substrate. Thus, the position and orientation of the substrate with respect to the substrate support pad 32 is known. For said docking, the intermediate chamber 48 is provided with a second docking element 46B and the substrate support pad 32 is provided with a second complementary docking element 45B. The docking element 46B and the complementary docking element 45B form together a docking system, such as the one that is described in more detail in relation to FIG. 7. This second docking system 45B, 46B may be identical to the first docking system 45A, 46A, but may take other forms as well.

After taking the substrate from the intermediate chamber 48 into the vessel 2, the robot driving the substrate support pad 32 introduces the substrate in the conditioned environment 20 of the lithographic apparatus. Thereto, an opening through the apparatus wall 20A and a gas-tight, preferably flexible seal 22 creating a passageway to the vessel 2 are provided. Again, to prevent loss of information of position and orientation of the substrate, the substrate support pad 32 is docked before placing the substrate in the lithographic apparatus. Thus, the position and orientation of the substrate with respect to the lithographic apparatus is known.

For docking, the support structure 34 inside the lithographic apparatus receiving the substrate is provided with a third docking element 46C, such as the one that is described in more detail in relation to FIG. 7. This third docking element 46C may be identical to the first and/or second docking elements 46A, 46B, but may take other forms as well. Advantageously, the third docking element 46C forms a docking system together with the second complementary docking element 45B, thus the complementary docking element 45B may be used in combination with the second and the third docking element 46B and 46C. In such a case only one complementary docking element 45B needs to be mounted on the substrate support pad 32 instead of two separate complementary docking elements 45B for each docking element 46B and 46C.

The third docking element 46C may be different from the other docking elements 46A and 46B, since the docking element 46C may be attached to the support structure 34. The support structure 34 may be a moveable stage and may therefore advantageously be provided with a lightweight docking element 46C. Weight of the other docking elements 46A and 46B is of less importance, since they are mounted on non-moveable parts of the insertion device 42. Further, since the vessel 2 and the conditioned environment 20 may be substantially continuously under the same conditions, they are more thermally stable. Due to this thermal stability, the tolerance of the docking element 46C may be larger than the tolerances of the other docking elements 46A and 46B.

After positioning the substrate on the support structure 34, the substrate support pad 32 may be retracted into the vessel 2. In the lithographic apparatus, the substrate is processed. This may be performed at the position where the substrate is positioned by the substrate support pad 32 or the substrate may be transported to any other location inside the lithographic apparatus. Essentially, after processing, the substrate is positioned at a location where the substrate support pad 32 may take or receive the substrate again and take it into the vessel 2.

As mentioned before, the substrate may now be transferred along the same trajectory it entered the insertion device 42, but in the reverse direction. Such a configuration limits the throughput of the insertion device 42, since processed substrates need to be removed before inserting new substrates to be processed. Therefore, the insertion device 42 as illustrated in FIG. 6 is provided with a second intermediate chamber 49 through which the processed substrate may be unloaded, while substantially simultaneously another substrate to be processed is provided in the first intermediate chamber 48.

After closing a corresponding transfer gate 44B, the unload pad 38 may take the substrate from the second intermediate chamber 49 through an unload gate 47 to the load device 40.

FIG. 7 shows a docking system 50 comprising a docking plate 52 and a docking device 54 for docking a carrier, for example. A carrier may carry a substrate of which the position and/or orientation are accurately known with respect to the carrier. Such a carrier may be a robot having a substrate support pad for transferring the substrate from one position to another, for example the robots with a load pad 28, an unload pad 38 or a substrate support pad 32 as indicated in FIG. 6.

To prevent loss of information of position and orientation of the substrate, the carrier may be positioned accurately using docking. Also, the substrate position is independent from any position error of the robot. The carrier is accurately positioned by docking, because its position is accurately known with respect to the docking plate 52 or docking device 54, depending on which one of the two parts 52, 54 of the docking system 50 is positioned on the carrier. Since the position of the substrate is accurately known with respect to the carrier, the position of the substrate with respect to the docking system 50 is accurately known. So, after the carrier has released the substrate, the position of the substrate is accurately known with respect to the docking system 50 independent from any error in the movement of by the robot.

The design of known docking systems comprise bearings that require lubrication. Lubrication, however, cannot be used in a conditioned environment, e.g. an environment having a reduced pressure or reduced particle concentration, because of possible contamination. Contamination of a conditioned environment results in high cleaning, i.e. repairing costs, since the conditioned environment will be exposed to outside conditions during repair and needs to be conditioned thereafter. Ceramic bearings not requiring lubrication are not available or at least very difficult to acquire in a required tolerance level and are sensitive to damage. The docking system 50 shown in FIG. 7 does not require lubrication, comprises only commercially available elements and materials and meets the required tolerances for docking and may therefore advantageously be used in a conditioned environment.

The docking system shown in FIG. 7 comprises a docking plate 52 having a V-shaped segment 56 and a straight segment 58. The straight segment 58 may, however, be omitted and an accurate edge of the docking plate 52 may be used instead as will be explained below. The docking device 54 comprises three cues 60A-60C fixedly connected to a base plate 62. The two parts of the docking system 50, i.e. the docking plate 52 and the docking device 54, may be mounted on two constructions that need to be positioned relative to each other.

Engaging said two parts accurately positions the two parts, and therefore the constructions they are mounted on, relative to each other in three degrees of freedom: x- and y-position and rotation (orientation) $R_{xy}$. There is no limitation of the position and orientation of the docking parts 52, 54 in any other direction. Thereto, cue-tips 61A-61C are ball-shaped.

To accurately position the two docking parts 52, 54 relative to each other in the above-mentioned directions, the bisector (i.e. a line through an angle dividing said angle in two equal angles), of the angle of the tip of the V-shaped segment 56 should be perpendicular to the edge of the straight segment 58. In case the straight segment 58 is omitted and the edge of the docking plate 52 is used, the bisector should be perpendicular to said edge.

The cues 60A-60C are positioned and oriented corresponding to the edges of the V-shaped segment 56 and the straight segment 58. That means that the cues 60 extend perpendicular to the edge they need to engage, for example as indicated in FIG. 7, the cues 60A and 60B extend perpendicular to the corresponding edges of the V-shaped segment 56 and cue 60C extends perpendicular to the straight segment 58.

When the V-shaped segment 56 engages the two corresponding cue-tips 61A and 61B, the position of the V-shaped segment 56 is determined. The docking plate 52 may however have an unknown orientation (rotation). When the straight segment 58 engages its corresponding cue-tip 61C, the orientation of the docking plate 52 is also determined, thus the position and orientation of the two docking parts 52, 54 are known relative to each other.

As mentioned above, the docking system 50 shown in FIG. 7 may advantageously be employed in a transfer or insertion device as shown in FIG. 6. In FIG. 6, three docking elements 46A, 46B, and 46C are indicated. These docking elements 46A-46C may be either one of the two docking parts 52 or 54 as illustrated in FIG. 7. The other complementary part 54 or 52, respectively, may then be mounted on the load pad 28 or the object support pad 32. For example, for transferring a substrate from the load device 40 to the load position 30 and accurately positioning the substrate on the load position 30, the object support pad 28 is provided with the docking plate 52 (forming the complementary docking element 45A shown in FIG. 6). The docking element 46A (FIG. 6) is formed by the docking device 54.

When the load pad 28 has entered the intermediate chamber 48 to transfer a substrate to the load position 30, the docking plate 52 on the load pad 28 engages the docking device 54. Thus, the load pad 28 is accurately positioned with respect to the intermediate chamber 48 and thus the load position 30. The substrate may then be left at the load position 30 and the load pad 28 may withdraw from the intermediate chamber 48.

The materials used for the docking system 50 may be selected such that a minimum of contamination and/or wear is expected during use. These materials may however have different characteristics from the system they are attached to, such as the insertion device 42 shown in FIG. 6. For example, the coefficient of thermal expansion may be different which may result in a deteriorated accuracy of positioning when the temperature of the system changes. A distance between the load position 30 and the docking element 46A changes due to temperature changes. Manufacturing the intermediate chamber 42 of a material having a low coefficient of thermal expansion is very expensive.

It is therefore known to condition the environment, in which the system is positioned, with respect to the temperature. Keeping the temperature of the environment at a predetermined level however is also expensive.

It is also known to use a temperature-controlled airflow to keep at least the system at a predetermined temperature, which requires additional hardware and results in corresponding costs and imposes design restrictions.

To reduce docking errors on the substrate position due to the influence of temperature changes, each or one of the docking parts 52, 54 may be mounted on a separate frame, preferably of a material having a low coefficient of thermal expansion, such as Invar. Said frame is then mounted on the construction to be positioned using specifically positioned and orientated leaf springs as will be described in relation to FIGS. 8A and 8B.

FIG. 8A schematically illustrates the relative positions and orientations of a docking frame 64 and leaf springs 68A, 68B, and 68C with respect to a substrate position 66 having a position center 66C of a substrate to be positioned. The docking frame 64 has a small coefficient of thermal expansion. A docking plate 52 is attached to the docking frame 64, although it could as well be a docking device as illustrated in and described in relation to FIG. 7. Dash-dotted orientation lines 70A, 70B, and 70C indicate an orientation of and are thereto perpendicular to the leaf springs 68A, 68B, and 68C, respectively. FIG. 8B shows how the docking frame 64 is connected to and supported by a base frame BF using the leaf springs 68A-68C.

Referring to FIGS. 6, 7 8A and 8B, the construction illustrated in FIG. 8A with a base frame BF and a docking frame 64 having a small coefficient of thermal expansion may advantageously be employed in the transfer and insertion device illustrated in FIG. 6. The substrate position 66 may be the load position 30, for example, and the docking plate 52 may be the docking element 46A. Due to rapid changes in the environmental conditions in the interior of the intermediate chamber 48, the base frame BF may be heated and may expand. Unfortunately, that would cause a positioning error, since the relative position of the docking plate 52 (i.e. docking element 46A in FIG. 6) would change with respect to the load position 30. It is therefore advantageous that the relative position between the load position 30 and the docking element 46A is not influenced by temperature changes, as mentioned above. Thereto, in FIGS. 8A and 8B, the docking plate 52 is mounted on a docking frame 64 which is mounted on the base frame BF using leaf springs 68A-68C. Hereinafter, it is described how the construction is designed and how it functions to keep said relative position despite any temperature changes.

The leaf springs 68A-68C are positioned and orientated such that the corresponding orientation lines 70A-70C intersect at the center 66C of the substrate position 66. When a carrier positions a substrate at the substrate position 66, the carrier first docks using the docking plate 52. By docking at docking plate 52, the position of the carrier and thus of the substrate is accurately known as described above. The actual position of the substrate may however differ from the indicated substrate position 66. The indicated substrate position 66 is only an intended position to ensure that another carrier may take the substrate as shown in, and described in relation to, FIG. 6. Thus, the carrier is docked such that the substrate is substantially positioned at the substrate position 66. The position of the substrate on the carrier however is accurately known with respect to said carrier, but is not accurately positioned relative to the carrier. Thus the position of the substrate may differ with respect to the substrate position 66, but the difference is accurately known with respect to the center 66C. Thereto, the position of the docking plate 52 is accurately known with respect to the center 66C, thereby enabling accurate positioning of the carrier with respect to said center 66C.

The position of another docking plate (for example docking element 46B in FIG. 6) for docking another carrier (such as substrate support pad 32) is also accurately known with respect to the center 66C and thus, the position of the substrate, when positioned on the substrate position 66 is also accurately known with respect to said other docking plate.

Referring to FIG. 8A, the leaf springs 68A-68C may only bend in the direction of the orientation lines 70A-70C, respectively. All other directions are fixed by the leaf springs 68. When the temperature of the system changes, the docking frame 64 and the base frame BF expand differently (as mentioned it is assumed and preferred, to use different materials). Hereinafter, the system will be described assuming that the base frame BF has expanded due to an increase in temperature, whereas the docking frame 64 has not. In reality, the docking frame 64 will also expand, but differently from the base frame BF, presumably less than the base frame BF.

Due to the expansion of the base frame BF, the leaf springs 68 exert a force on the docking frame 64 in the direction of the expansion of the base frame BF along the respective orientation lines 70. The leaf springs 68A and 68B exert forces outward from the docking frame 64 having force components in both x- and y-directions. The force component in the x-direction of leaf spring 68A is anti-parallel to the x-component of the force exerted by leaf spring 68B. Therefore, these forces in the x-direction cancel each other, resulting in no movement of the docking frame 64 and docking plate 52 in the x-direction.

The y-components of the forces exerted by the leaf springs 68A and 68B are parallel and are added. The force exerted by the leaf spring 68C is however anti-parallel to said y-components of leaf springs 68A and 68B. Selecting a suitable leaf spring 68C results in also canceling the force in the x-direction, resulting in no movement of the docking frame 64 and docking plate 52 in the x-direction. Since there is no movement in the x- and y-direction, the docking plate 52 substantially stays at its position and it does not substantially rotate. Thus, the accurately known position and orientation of the substrate is secured.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. An insertion device configured to insert an object from a first environment having a first set of environmental conditions to a second environment having a second set of environmental conditions, the insertion device comprising:
   a vessel supported by a frame and having a vessel wall, an interior of the vessel being conditionable, wherein the vessel is essentially dynamically decoupled from the frame;
   a gate positioned in said vessel wall, said gate configured to enable the transfer of said object into said vessel, out of said vessel, or both;
   an insertion robot supported by the frame and having a robot arm, the robot arm having at least a portion thereof extending into said vessel; and
   an object support pad coupled to said portion of said robot arm that extends into said vessel, said object support pad configured to carry said object along a predetermined trajectory through said gate,
   wherein the robot arm is essentially dynamically decoupled from the frame and the vessel wall in at least one degree of freedom.

2. The insertion device of claim 1, wherein said robot arm and said vessel wall are flexibly coupled such that an orientation of the robot arm in a direction of movement of said robot arm is independent from an orientation of said vessel wall.

3. The insertion device of claim 1, wherein said robot arm extends into said vessel through an opening in said vessel wall, the opening being sealed by a flexible and gas-tight seal.

4. The insertion device of claim 3, wherein said insertion robot and said vessel are mounted on a frame using a flexible mounting assembly.

5. The insertion device of claim 3, wherein said seal is an arrangement of bellows.

6. The insertion device of claim 3, wherein said seal is attached to said vessel wall and said robot arm.

7. The insertion device of claim 3, wherein said robot has a gas-tight robot housing with a seal that is attached to said vessel wall and said robot housing.

8. The insertion device of claim 1, wherein said robot has a gas-tight robot housing that is attached to said vessel wall, and wherein the robot arm is flexibly coupled to said robot housing.

9. The insertion device of claim 8, wherein a gyrostabilizer flexibly couples said robot housing and said robot arm such that a change of orientation of said vessel wall does not influence the predetermined trajectory of said object support pad.

10. The insertion device of claim 1, wherein said object support pad is provided with at least a part of a docking system to position said object at a predetermined object location.

11. The insertion device of claim 10, wherein said docking system comprises a first and a second part, said first part being provided on said object support pad, and said second part being positioned with respect to said predetermined object location whereby said first and said second part engage in a predetermined manner when said object support pad reaches said predetermined object location.

12. The insertion device of claim 11, wherein said second part of said docking system is mounted on a docking frame using a plurality of leaf springs.

13. The insertion device of claim 12, wherein each of the leaf springs is positioned to bend in a direction of a line, the lines corresponding to the respective leaf springs intersecting at a center of the predetermined object location.

14. The insertion device of claim 13, wherein one of said first and second part of the docking system is a docking plate comprising a V-shaped segment and a straight segment, and the other part is a docking device comprising three cues, one of said cues being configured to engage an edge of the straight segment of the docking plate, the other two cues being configured to engage respective edges of the V-shaped segment.

15. A lithographic apparatus, comprising:
- a support structure configured to support a patterning device that imparts a desired pattern to a beam of radiation;
- a substrate holder configured to hold a substrate; and
- an insertion device configured to transfer a substrate or a patterning device into and/or out of a conditioned environment, the insertion device comprising:
  - a vessel supported by a frame and having a vessel wall which defines an interior that is conditionable, wherein the vessel is essentially dynamically decoupled from the frame;
  - a gate positioned in said vessel wall, said gate configured to enable the transfer of said object into said vessel, out of said vessel, or both;
  - an insertion robot supported by the frame and having a robot arm in which at least a portion of said robot arm extends into said vessel interior; and
  - an object support pad coupled to said portion of said robot arm that extends into said vessel interior, said object support pad configured to carry said object along a predetermined trajectory through said gate,
  - wherein the robot arm is essentially dynamically decoupled from the frame and the vessel wall in at least one degree of freedom.

16. The lithographic apparatus of claim 15, wherein said object support pad carries said substrate between said vessel and said substrate holder or carries said patterning device between said vessel and said support structure through a gas-tight passageway.

17. The lithographic apparatus of claim 16, wherein said passageway is created by an arrangement of bellows.

18. The lithographic apparatus of claim 15, wherein said insertion device is provided with a load position and an unload position for loading a first substrate or a first patterning device and unloading a second substrate or a second patterning device, wherein a direction of said loading and unloading is substantially parallel to a base of the insertion device.

19. The lithographic apparatus of claim 18, further comprising:
- a conditionable load chamber in which the load position is located, said conditionable load chamber having a load gate that accesses an outside environment for receiving said substrate or said patterning device from an outside environment; and
- a conditionable unload chamber in which the unload position is located, said conditionable unload chamber having an unload gate that accesses said outside environment for delivering said substrate or said patterning device to said outside environment;
- wherein said conditionable load and unload chambers each have a transfer gate to said vessel for transferring said substrate or said patterning device between said load or unload chamber and said vessel.

* * * * *